(12) United States Patent
Jiang et al.

(10) Patent No.: US 7,847,631 B2
(45) Date of Patent: Dec. 7, 2010

(54) METHOD AND APPARATUS FOR PERFORMING PREDISTORTION

(75) Inventors: Hong Jiang, Warren, NJ (US); Paul A. Wilford, Bernardsville, NJ (US)

(73) Assignee: Alcatel-Lucent USA Inc., Murray Hill, NJ (US)

( * ) Notice: Subject to any disclaimer, the term of this patent is extended or adjusted under 35 U.S.C. 154(b) by 40 days.

(21) Appl. No.: 12/384,512

(22) Filed: Apr. 6, 2009

(65) Prior Publication Data
US 2010/0253425 A1    Oct. 7, 2010

(51) Int. Cl.
*H03F 1/26* (2006.01)
(52) U.S. Cl. .................................. 330/149; 375/296
(58) Field of Classification Search .............. 330/149; 375/296–297; 455/114.3
See application file for complete search history.

(56) References Cited

U.S. PATENT DOCUMENTS

| | | | |
|---|---|---|---|
| 7,202,737 | B2 | 4/2007 | Schaepperle et al. |
| 7,269,231 | B2 * | 9/2007 | Ding et al. ............... 375/296 |
| 2003/0063686 | A1 * | 4/2003 | Giardina et al. ........... 375/296 |
| 2004/0239422 | A1 | 12/2004 | Schaepperle et al. |

OTHER PUBLICATIONS

"A Comparative Analysis of Behavioral Models for RF Power Amplifiers", IEEE transc. microwave theory tech, vol. 54, No. 1, 2006, p. 348.
"A Comparative Overview of Microwave and Wireless Power-Amplifier Behavioral Modeling Approaches", IEEE transc. microwave theory tech, vol. 53, No. 4, 2005, p. 1150.
"A Generalized Memory polynomial Model for Digital Predistortion of RF Power Amplifiers", IEEE transc signal processing, vol. 54, No. 10, 2006, p. 3852.

"A Robust Digital Baseband Predistorter Constructed Using Memory Polynomials", IEEE Transactions on Communications, vol. 52, No. 1, 2004, p. 159.
"Digital Predistortion Linearization and Crest Factor Reduction for Wideband Applications", Wan-Jong Kim, Ph.D. Thesis, Simon Fraser University, 2006.
"Accurate Modeling of Wideband RF Doherty Power Amplifiers Using Dynamic Nonlinear Models", ICMMT2008 Proceedings, 2008.

(Continued)

*Primary Examiner*—Hieu P Nguyen
(74) *Attorney, Agent, or Firm*—J. K. Jacobs

(57) ABSTRACT

Embodiments are described herein to provide better predistortion solutions for the linearization of high power amplifiers, especially those with memory effects. Many embodiments involve a method in which a predistorted signal $z_n$ is generated from input signal $x_n$ in accordance with $$z_n = \sum_{k=1}^{K} \prod_{q=1}^{Q} P_{kq}(x_{n-q-1})$$
$$= P_{11}(x_n)P_{12}(x_{n-1}) \ldots P_{1Q}(x_{n-Q-1}) +$$
$$P_{21}(x_n)P_{22}(x_{n-1}) \ldots P_{2Q}(x_{n-Q-1}) + \ldots +$$
$$P_{K1}(x_n)P_{K2}(x_{n-1}) \ldots P_{KQ}(x_{n-Q-1})$$

for K terms and Q−1 delays, wherein each $P_{kq}$ is a complex valued function of a single complex variable. Also described are predistorter apparatus embodiments in which a predistorter includes complex multipliers for multiplying the value of each $P_{kq}$ having the same value of k to produce K products and at least one adder for adding the K products to generate predistorted signal $z_n$ from input signal $x_n$ in accordance with the equation above.

13 Claims, 11 Drawing Sheets

OTHER PUBLICATIONS

"Behavioral Modeling of Nonlinear RF Power Amplifiers Considering Memory Effects", IEEE transc microwave theory tech, vol. 51, No. 12, 2003, p. 2495.

"Frequency-Independent and Frequency-Dependent Nonlinear Models of TWT Amplifiers", IEEE Trans Communications, vol. COM-29, No. 11, 1981, p. 1715.

"Representation by Sums of Separable Functions in n Dimensions", RM-83, U.S. Air Force Project Rand Research Memorandum, Dec. 1948.

Anding Zhu et al; "Open-Loop Digital Predistorter for RF Power Amplifiers . . . "IEEE Transactions on Microwave Theory & Techniques, vol. 56, No. 7, Jul. 1, 2008, pp. 1524-1534.

Anding Zhu et al: "Pruning the Volterra Series for Behavioral Modeling of Power Amplifiers . . . ", IEEE Trans on Microwave Theory & Tech., vol. 55, No. 5, May 1, 2007, pp. 813-821.

* cited by examiner ing the value of each P<sub>kq</sub> ...

METHOD AND APPARATUS FOR PERFORMING PREDISTORTION

FIELD OF THE INVENTION

The present invention relates generally to communications and, in particular, to predistortion techniques in communications.

BACKGROUND OF THE INVENTION

The best existing solutions for predistortion of power amplifiers with memory effects are predistortion methods that use polynomials or piecewise polynomials with delays. In these existing solutions, the predistortion is accomplished by the use of polynomials or piecewise polynomials with some delay terms. The disadvantages of these solutions often include one or more of the following: a non-uniform approach to handling memory effects, an ad hoc arrangement of polynomials (or piecewise polynomials) with delays, no clear metric for judging why one ad hoc arrangement is better than another, each ad hoc arrangement used ignores certain aspects of the memory effects (e.g., ignores certain cross-term effects), the predistortion is limited to the use of polynomials or piecewise polynomials, and polynomials/piecewise polynomials become unstable when a high degree is used, although orthogonal polynomial may alleviate the instability. Therefore, new solutions for predistortion that are able to address some of these known issues in are desirable.

Figure 1:
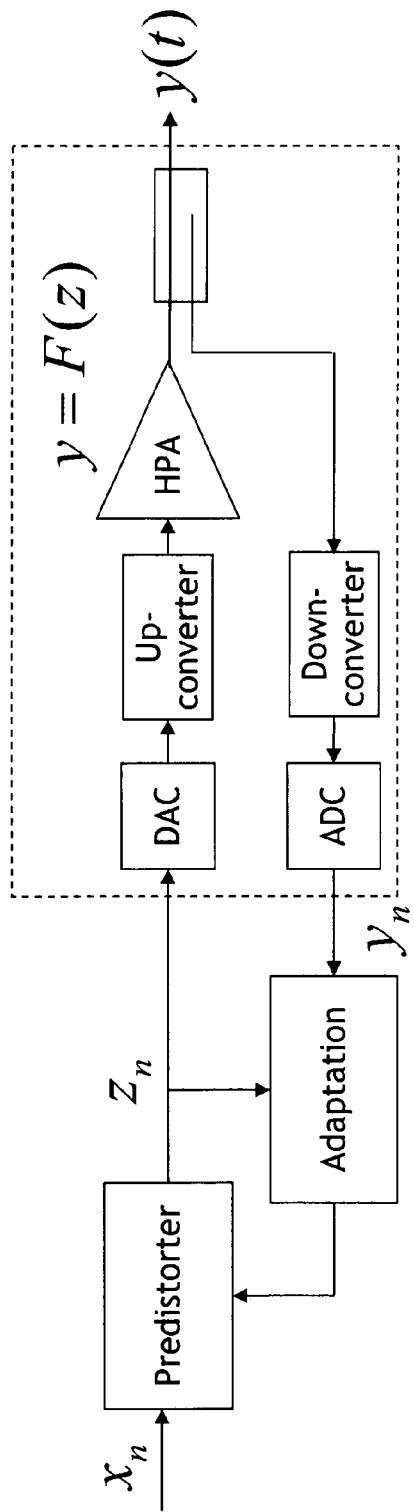
FIG. 1 is a block diagram depiction illustrating an architecture for using time domain predistortion to linearize the output of a high power amplifier (HPA).

Specific embodiments of the present invention are disclosed below with reference to FIGS. 1-11. Both the description and the illustrations have been drafted with the intent to enhance understanding. For example, the dimensions of some of the figure elements may be exaggerated relative to other elements, and well-known elements that are beneficial or even necessary to a commercially successful implementation may not be depicted so that a less obstructed and a more clear presentation of embodiments may be achieved. In addition, although the logic flow diagrams above are described and shown with reference to specific steps performed in a specific order, some of these steps may be omitted or some of these steps may be combined, sub-divided, or reordered without departing from the scope of the claims. Thus, unless specifically indicated, the order and grouping of steps is not a limitation of other embodiments that may lie within the scope of the claims.

Simplicity and clarity in both illustration and description are sought to effectively enable a person of skill in the art to make, use, and best practice the present invention in view of what is already known in the art. One of skill in the art will appreciate that various modifications and changes may be made to the specific embodiments described below without departing from the spirit and scope of the present invention. Thus, the specification and drawings are to be regarded as illustrative and exemplary rather than restrictive or all-encompassing, and all such modifications to the specific embodiments described below are intended to be included within the scope of the present invention.

SUMMARY OF THE INVENTION

To address the need for new solutions for predistortion, various embodiments are described. Many embodiments involve a method in which a predistorted signal $z_n$ is generated from input signal $x_n$ in accordance with $$z_n = \sum_{k=1}^{K} \prod_{q=1}^{Q} P_{kq}(x_{n-q-1})$$

$$= P_{11}(x_n)P_{12}(x_{n-1}) \ldots P_{1Q}(x_{n-Q-1}) +$$
$$P_{21}(x_n)P_{22}(x_{n-1}) \ldots P_{2Q}(x_{n-Q-1}) + \ldots +$$
$$P_{K1}(x_n)P_{K2}(x_{n-1}) \ldots P_{KQ}(x_{n-Q-1})$$

for K terms and Q-1 delays, wherein each $P_{kq}$ is a complex valued function of a single complex variable.

In some embodiments, the method also includes one or more of the following: using a polynomial to compute the value of at least one $P_{kq}$ or using a look-up-table (LUT) to compute the value of at least one $P_{kq}$. Again, depending on the embodiment one or more of the following may apply: K=Q, $P_{kq}$ is implemented as a function of the amplitude of x, where $P_{kq}=P_{kq}(|x|)$, each $P_{kq}$ is computed using a look-up-table (LUT) of one real variable $|x|$, each $P_{kq}$ is computed using a polynomial of $|x|$, each $P_{kq}$ is computed using a piecewise polynomial of $|x|$, each $P_{kq}$ is computed using an orthogonal polynomial of $|x|$, each $P_{kq}$ is computed using a look-up-table (LUT) where the entries of at least one of the LUTs is computed using an iterative least squares technique, $P_{kq}=1$ for $P_{kq}$ in which k is not equal to q, or where generating predistorted signal $z_n$ from input signal $x_n$ comprises generating by a field-programmable gate array (FPGA) pre-distorted signal $z_n$ from input signal $x_n$.

Also described are predistorter apparatus embodiments in which a predistorter includes complex multipliers for multiplying the value of each $P_{kq}$ having the same value of k to produce K products and at least one adder for adding the K products to generate predistorted signal $z_n$ from input signal $x_n$ in accordance with $$z_n = \sum_{k=1}^{K} \prod_{Q=1}^{Q} P_{kq}(x_{n-q-1})$$

$$= P_{11}(x_n)P_{12}(x_{n-1})\ldots P_{1Q}(x_{n-Q-1})$$

$$+ P_{21}(x_n)P_{22}(x_{n-1})\ldots P_{2Q}(x_{n-Q-1})$$

$$+ \ldots$$

$$+ P_{K1}(x_n)P_{K2}(x_{n-1})\ldots P_{KQ}(x_{n-Q-1})$$

for K terms and Q−1 delays, wherein each $P_{kq}$ is a complex valued function of a single complex variable.

DETAILED DESCRIPTION OF EMBODIMENTS

Embodiments are described herein to provide better predistortion solutions for the linearization of high power amplifiers, especially those with memory effects. High power amplifiers in radio waves are nonlinear, causing distortion in the transmitted RF signal. Predistortion is a technique to process the signal before it is sent to an amplifier so that the output signal from the amplifier is linear with respect the signal to be transmitted; hence, removing the distortion caused by the nonlinearity of the amplifier.

Various embodiments describe a predistorter that is a sum of separable functions. This is based on the theory that a multivariate function can be approximated by a sum of separable functions. Embodiments described provide a uniform approach using separable functions to handle the memory effects of power amplifiers (PAs). Full memory effects are taken into consideration. Also, the predistortion does not need to be implemented with polynomials or piecewise polynomials, and therefore, may not suffer the instability exhibited in polynomial predistortion methods. As a result, embodiments described are able to provide predistortion that has better performance and lower complexity. This can translate into better use and increased efficiency of power amplifiers, which can further translate into better data transmission coverage.

To provide a greater degree of detail in making and using various aspects of the present invention, a description of certain, quite specific, embodiments follows for the sake of example. FIGS. 1-11 are referenced in an attempt to illustrate some examples of specific embodiments of the present invention and/or how some specific embodiments may operate.

A list of references is provided below and is referred throughout the description that follows:

[1] "A comparative analysis of behavioral models for RF power amplifiers", IEEE transc. microwave theory tech, Vol 54, No. 1, 2006, p 348

[2] "A comparative overview of microwave and wireless power-amplifier behavioral modeling approaches", IEEE transc. microwave theory tech, Vol 53, No 4, 2005, p 1150.

[3] "A generalized memory polynomial model for digital predistortion of RF power amplifiers", IEEE transc signal processing, Vol. 54, No. 10, 2006, p 3852.

[4] "A robust digital baseband predistorter constructed using memory polynomials", IEEE TRANSACTIONS ON COMMUNICATIONS, VOL. 52, NO. 1, 2004, p 159.

[5] "Digital predistortion linearization and crest factor reduction for wideband applications", Wan-Jong Kim, Ph.D. Thesis, Simon Fraser University, 2006

[6] "Accurate Modeling of Wideband RF Doherty Power Amplifiers Using Dynamic Nonlinear Models", ICMMT2008 Proceedings, 2008

[7] "Behavioral Modeling of Nonlinear RF Power Amplifiers Considering Memory Effects", IEEE transc. microwave theory tech, VOL. 51, NO. 12, 2003, p 2495

[8] "Frequency-Independent and Frequency-Dependent Nonlinear Models of TWT Amplifiers", IEEE TRANS COMMUNICATIONS, VOL. COM-29, NO. 11, 1981, p 1715

[9] "Method of influencing an input signal and predistorter", U.S. patent application, US 2004/0239422 A1, December, 2004.

[10] "Representation by sums of separable functions in n dimensions", RM-83, U.S. Air Force Project Rand Research Memorandum, December, 1948.

One use of predistortion techniques is to linearize power amplifiers. Such predistortion can be performed either in the time domain or the frequency domain. Time domain predistortion is typically used for RF amplifiers. See e.g., [3], [4] and [5]. The principle of the time domain predistortion is illustrated in FIG. 1. The objective of the predistortion of diagram 100 is to linearize the output of the high power amplifier (HPA), i.e., $$y = F(\text{Predistorter}(x)) = G \cdot x$$

where G is the gain of the PA.

Polynomial Predistorters

Figure 2:
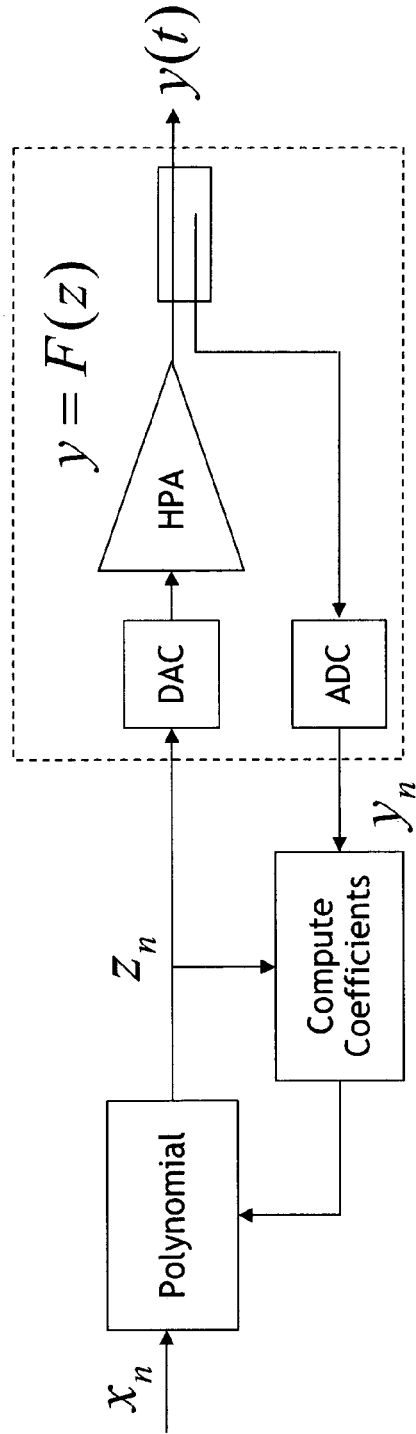
FIG. 2 is a block diagram depiction illustrating a polynomial predistorter architecture.
Figure 3:
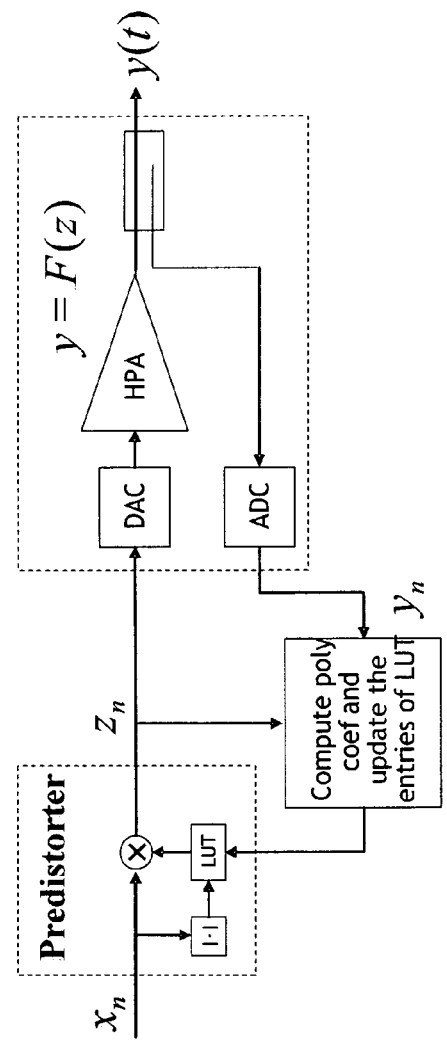
FIG. 3 is a block diagram depiction illustrating a polynomial predistorter implemented by a look-up-table (LUT).

Polynomials are widely used as predistorters. In polynomial predistortion, the predistorter is implemented by a polynomial or some variants of polynomials. Diagram 200 in FIG. 2 illustrates one polynomial predistorter architecture.

In an adaptive polynomial predistorter, the input signal is predistorted by a polynomial. The signal after predistortion is transmitted to the high power amplifier (HPA). The polynomial predistorter without memory effect is given in the form of the following equation:

$$z_n = x_n P(|x_n|) = x_n \sum_{k=0}^{K} c_k |x_n|^k$$

The input signal $x_n$ is multiplied by a polynomial of its amplitude $|x_n|$. The coefficients are $c_k$ are complex-valued.

The coefficients of the polynomial are computed adaptively by using an algorithm which utilizes both the input and output signals of the HPA. The details on the computation of the coefficients will be given below.

A polynomial predistorter is usually implemented by a look-up-table (LUT). The architecture of the implementation (polynomial without memory effect) is illustrated by diagram 300 in FIG. 3. In the predistorter, the input signal $x_n$ is multiplied by a value from the LUT. The value from the LUT is determined by the amplitude of $x_n$. The output $z_n$ from the predistoter is sent to the HPA after being converted to an analog signal.

The entries of the LUT are updated periodically. First, the coefficients of the polynomial are computed (as described below). Then, the computed polynomial is used to compute the entries of the LUT. In one implementation, the amplitude $|x_n|$ is quantized into 8 bits, resulting in the LUT table having 256 entries.

Polynomials with Memory

The polynomials described previously apply to power amplifiers without memory effects. To deal with power amplifiers having memory effects, memory polynomials may be used. See e.g., [3] and [4]. In a memory polynomial predistortion, the predistorter is given by $$z_n = P(x_n, x_{n-1}, \ldots, x_{n-Q+1}) = \sum_{q=1}^{Q} \sum_{k=0}^{K} C_{kq} x_{n-q} |x_{n-q}|^k$$

In above equation, $x_{n-q}$ represents the sample of the signal with delay q. Therefore, the predistortion depends on the samples $x_n, x_{n-1}, \ldots, x_{n-Q+1}$, where Q is the order of memory effect.

Figure 4:
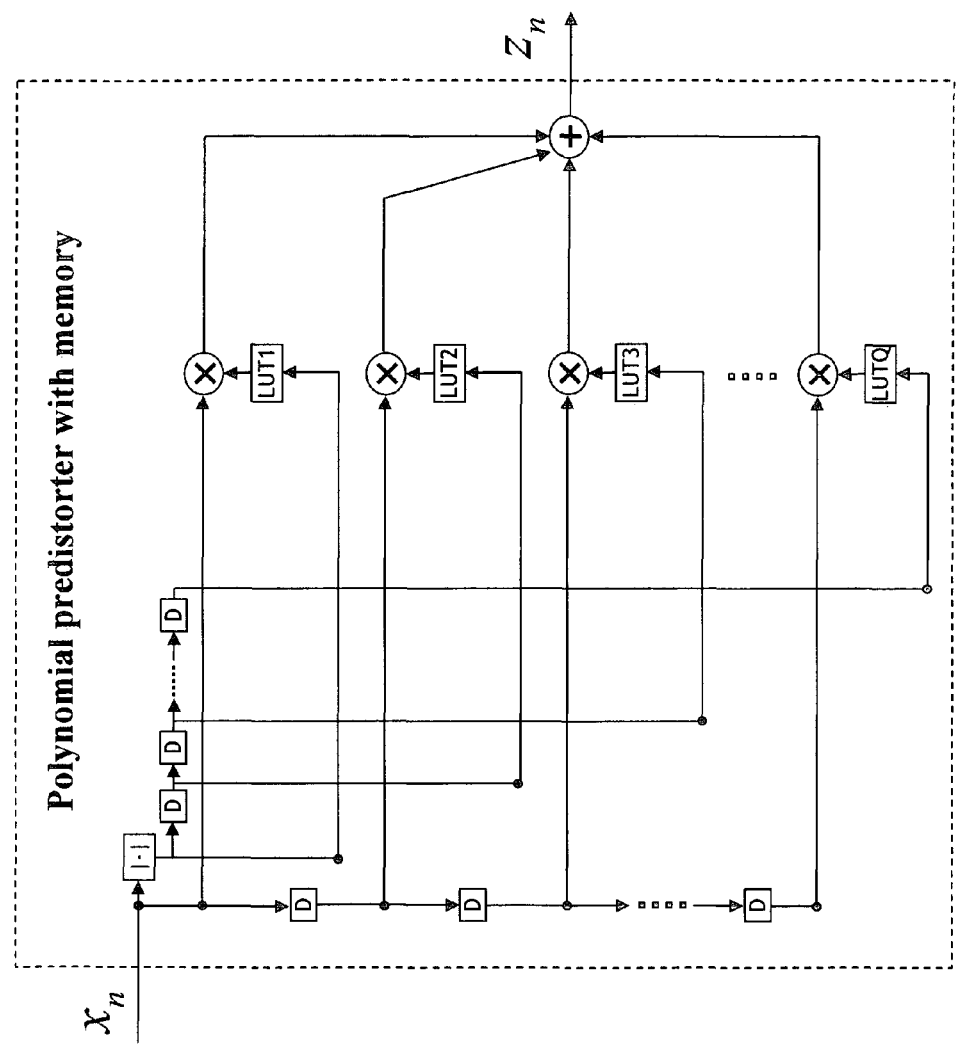
FIG. 4 is a block diagram depiction illustrating a polynomial predistorter with memory, implemented by a look-up-tables (LUTs).

A memory polynomial can also be implemented by LUTs as illustrated by diagram 400 in FIG. 4. The entries of the LUTs may be computed as follows. Let the maximum of amplitude |x| be $X_{max}$. Quantize |x| with B bits in the interval $[0, X_{max}]$. Each $LUT_q$ has $2^B$ entries, and the entries are computed as $$LUT_q(m) = \sum_{k=0}^{K} C_{kq} \left( \frac{m X_{MAX}}{2^B - 1} \right)^k, m = 0, 1, \ldots, 2^B - 1.$$

Piecewise Polynomials

A variant of a memory polynomial is described in [8]. The architecture of the predistorter is the same as that illustrated by diagram 400 in FIG. 4. However, each LUT is computed with a piecewise polynomial $$z_n = P(x_n, x_{n-1}, \ldots, x_{n-Q+1}) = \sum_{q=1}^{Q} x_{n-q} \sum_{k=0}^{K} C_{kq} \varphi_k(|x_{n-q}|),$$

where $\phi_k(r)$ is piecewise polynomial of degree 3 in real variable r. The entries of the LUTs can be computed as follows:

$$LUT_q(m) = \sum_{k=0}^{K} C_{kq} \varphi_k \left( \frac{m X_{MAX}}{2^B - 1} \right)^k, m = 0, 1, \ldots, 2^B - 1.$$

Orthogonal Polynomials

Another variant of a memory polynomial is an orthogonal polynomial. Orthogonal polynomials are more stable to compute. The architecture of the predistorter is the same as that illustrated by diagram 400 in FIG. 4, but the LUTs are computed using orthogonal polynomials $$z_n = P(x_n, x_{n-1}, \ldots, x_{n-Q+1}) = \sum_{q=1}^{Q} x_{n-q} \sum_{k=0}^{K} L_k(|x_{n-q}|),$$

where $L_k(r)$ is an orthogonal of degree k in the interval $r \in [0, X_{max}]$. For example, $L_k(r)$ can be chosen as a shifted, and scaled Legendre polynomial. The entries of the LUTs can be computed as $$LUT_q(m) = \sum_{k=0}^{K} C_{kq} L_k \left( \frac{m X_{MAX}}{2^B - 1} \right)^k, m = 0, 1, \ldots, 2^B - 1.$$

The Computation of Polynomial Predistortion

How the coefficients may be computed in the memory polynomials and their variants is described below. The basic approach is to find the coefficients so that the polynomial best approximates the inverse of the PA transfer function. As shown by diagram 500 in FIG. 5, the PA transfer function is defined as the output y being a function of input z. The inverse function is therefore defined by considering z being a function of y. The inverse function, although not known explicitly, can be observed by taking the input/output pair of the PA: z and y.

Therefore, the coefficients of the predistortion polynomials can be computed as follows:

Take a set of input, output samples from PA $z_n, y_n$, n=0, 1, ..., N−1

Assume the gain from the PA is G

Find the coefficients such that the error $\|z_n - P(y_n/G, y_{n-1}/G, \ldots, y_{n-Q+1}/G)\|$ is minimized.

In polynomial methods described previously, the least squares method can be used to minimize the error. The least squares method gives rise to linear equations for the coefficients. Let $c = (C_{01}, C_{11}, \ldots, C_{K1}, \ldots, C_{0Q}, C_{1Q}, \ldots, C_{KQ})^T$ be the (K+1)Q-vector of the coefficients, and A be the N×(K+1)Q matrix whose entries given by $$A = [a_{01}, a_{11}, \ldots, a_{K1}, \ldots, a_{0Q}, a_{1Q}, \ldots, a_{KQ}],$$

where each $a_{kq}$ is an N-vector given by $$a_{kq} = (a_{kq0}, a_{kq1}, \ldots, a_{kqN-1})^T, \text{ and}$$

$$a_{kqn} = (y_{n-q}/G) \psi_k(|y_{n-q}/G|),$$

and z the N-vector given by $z = (z_0, z_1, \ldots, z_{N-1})^T$. Then the coefficient vector c is the least squares solution to the following (over-determined) equation:

$$Ac = z.$$

In above equations, the function $\psi_k(|y_{n-q}/G|)$ is different depending on the type of polynomials used. For memory polynomials (see their section above), the function is given by $\psi_k(|y_{n-q}/G|) = |y_{n-q}/G|^k$. For piecewise polynomials (see their section above), the function is given by $\psi_k(|y_{n-q}/G|) = \phi_k(|y_{n-q}/G|)$, and for orthogonal polynomials (see their section above), the function is given by $$\psi_k(|y_{n-q}/G|) = L_k(|y_{n-q}/G|).$$

A Separable-function Predistorter Architecture

In existing algorithms, such as those described in [3], [4], [5] and [8], the predistorter is chosen ad hoc. For example, the predistorters in [4] and [8] lack cross-terms. The predistorters in [3] and [5] introduced certain cross-terms. Thus, there is a lack of uniformity in the approach to the cross-terms, and there is also a lack of criteria on how to choose between the cross-terms.

In contrast, an approach is presented herein that gives rise to a uniform architecture for predistortion, namely, the separable-function predistorter. Although a separable-function architecture has high complexity when implemented in full, simplifications can be made according to the available hardware platforms and resources. One advantage of a uniform approach using the separable-function predistorter is that it takes the guesswork out of predistortion design. One can start with a separable-function approach and tailor it according to the performance requirements and available resources.

The Ideal Predistorter

Figure 5:
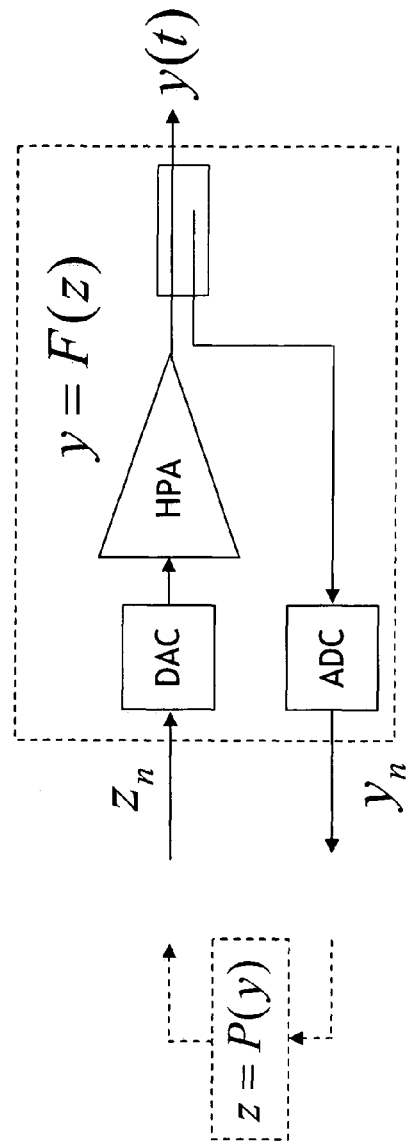
FIG. 5 is a block diagram depiction of an architecture for illustrating a PA transfer function and an inverse function.

FIG. 5 is a block diagram depiction of an architecture for illustrating a PA transfer function and an inverse function. In diagram 500, the ideal predistorter is the function $z=P(y/G)$, where z, y are the input and output of the PA, respectively.

If for every sequence $y_n, y_{n-1}, \ldots, y_0$, there exists a unique sequence $z_n, z_{n-1}, \ldots, z_0$, (modular initial conditions), such that $$y_n = F(z_n, z_{n-1}, \ldots, z_0),$$

then there is a well defined function $z_n = P(y_n/G, y_{n-1}/G, \ldots, y_0/G)$, and $z_n = P(x_n, z_{n-1}, \ldots, x_0)$ is the ideal predistorter Q is the length of memory effect if $z_n = P(y_n/G, y_{n-1}/G, \ldots, y_{n-Q+1}/G)$ for every n In above, the function P is a multivariate function with Q variables.

$$P = P(x^1, x^2, \ldots, x^Q)$$

Figure 6:
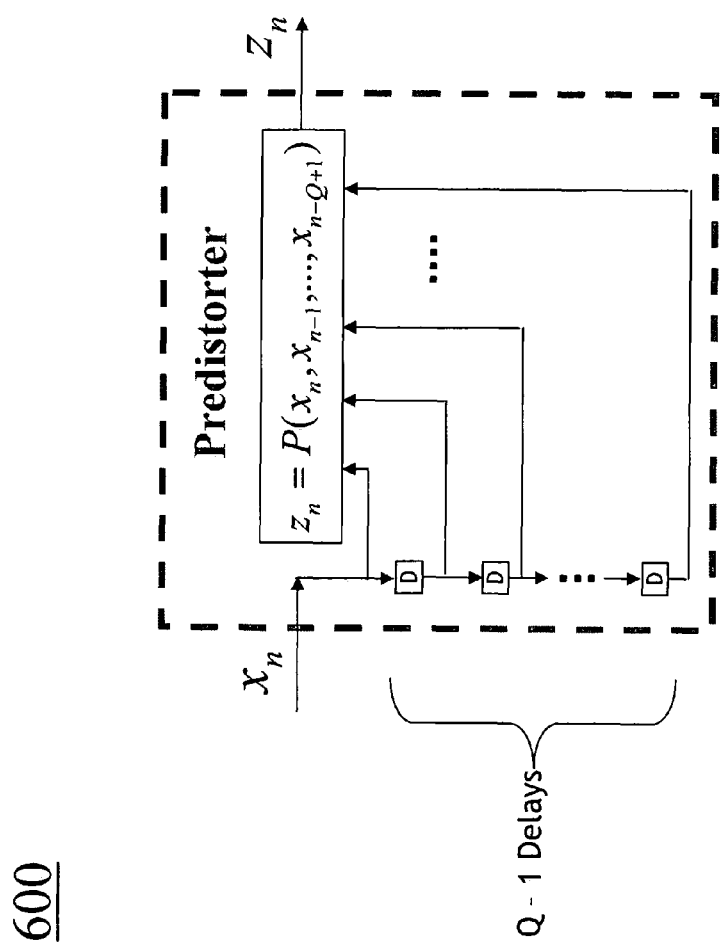
FIG. 6 is a block diagram depiction illustrating an ideal predistorter.

An ideal predistorter would then take the form illustrated by diagram 600 in FIG. 6.

The multivariate function is very difficult to approximate, due to the curse of dimensions. It is impractical to be implemented by LUTs. For example, if each dimension is quantized to 10 bits, then Q dimensions would require a LUT having $2^{10Q} = 1024^Q$ entries, which is too prohibitive even for moderate values of Q=3 or 4.

The Separable-function Predistorter

On the other hand, it is known in general (See e.g., [10]) that a multivariate function can be approximated by a sum of separable functions, that is, $$P(x^1, x^2, \ldots, x^Q) \approx \sum_{k=1}^{K} \prod_{q=1}^{Q} P_{kq}(x^q)$$

$$P(x^1, x^2, \ldots, x^Q) \approx P_{11}(x^1) P_{12}(x^2) \ldots P_{1Q}(x^Q)$$
$$+ P_{21}(x^1) P_{22}(x^2) \ldots P_{2Q}(x^Q)$$
$$+ \ldots$$
$$+ P_{K1}(x^1) P_{K2}(x^2) \ldots P_{KQ}(x^Q)$$

In the above, each $P_{kq}$ is a function of one complex variable. Therefore, a uniform, generic predistorter using separable functions can be defined by $$z_n = \sum_{k=1}^{K} \prod_{q=1}^{Q} P_{kq}(x_{n-q-1})$$

$$= P_{11}(x_n) P_{12}(x_{n-1}) \ldots P_{1Q}(x_{n-Q-1})$$
$$+ P_{21}(x_n) P_{22}(x_{n-1}) \ldots P_{2Q}(x_{n-Q-1})$$
$$+ \ldots$$
$$+ P_{K1}(x_n) P_{K2}(x_{n-1}) \ldots P_{KQ}(x_{n-Q-1})$$

Figure 7:
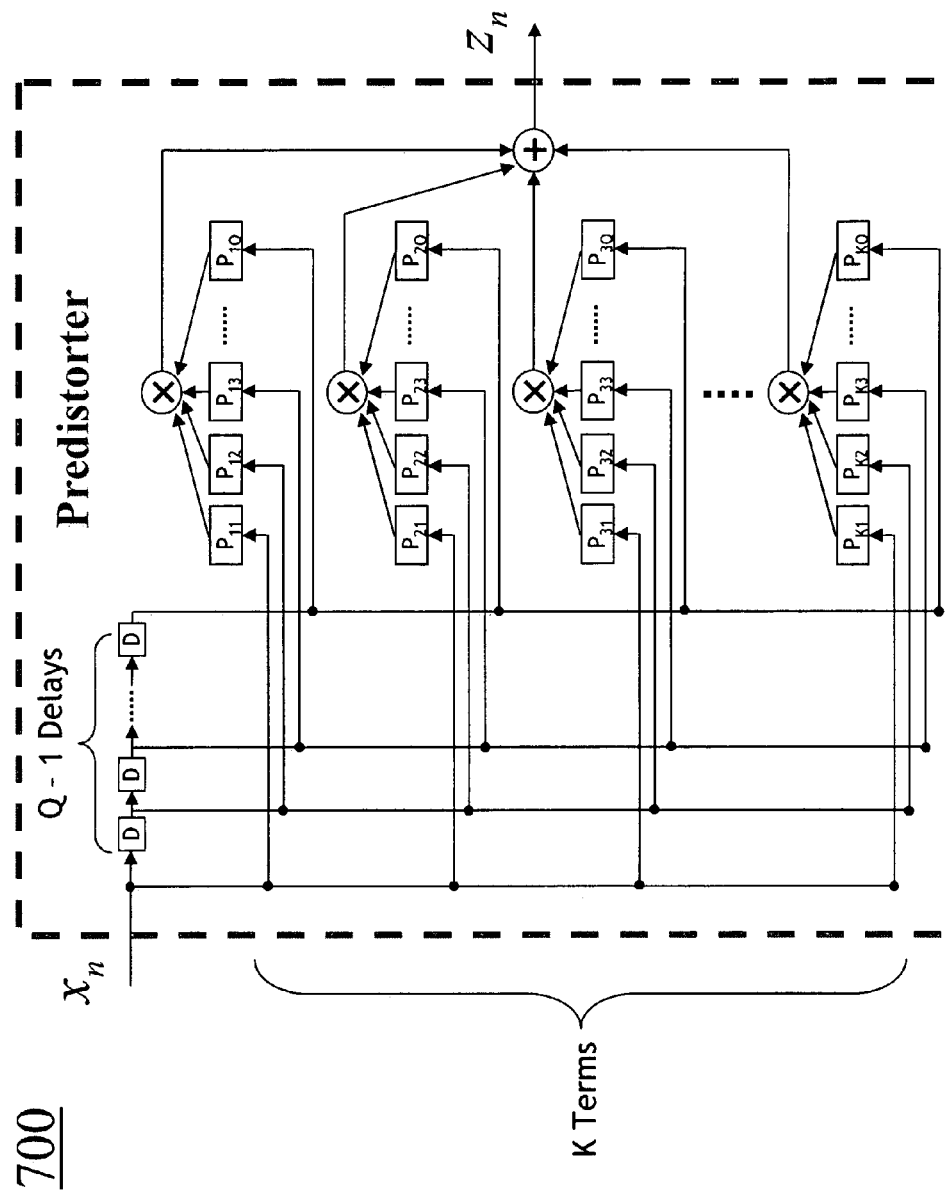
FIG. 7 is a block diagram depiction illustrating an architecture for a separable-function predistorter.

FIG. 7 is a block diagram depiction illustrating an architecture for a separable-function predistorter. In diagram 700, each $P_{kq}$ is a function of one complex variable. $P_{kq}$ can be computed using a variety of methods, such as polynomials or LUTs.

In the special case of K=Q, an equivalent predistorter can be defined as $$z_n = \sum_{k=1}^{Q} \prod_{q=1}^{Q} P_{kq}(x_{n-q-1})$$

$$= x_n P_{11}(x_n) P_{12}(x_{n-1}) \ldots P_{1Q}(x_{n-Q-1})$$
$$+ x_{n-1} P_{21}(x_n) P_{22}(x_{n-1}) \ldots P_{2Q}(x_{n-Q-1})$$
$$+ \ldots$$
$$+ x_{n-Q-1} P_{K1}(x_n) P_{K2}(x_{n-1}) \ldots P_{KQ}(x_{n-Q-1})$$

Figure 8:
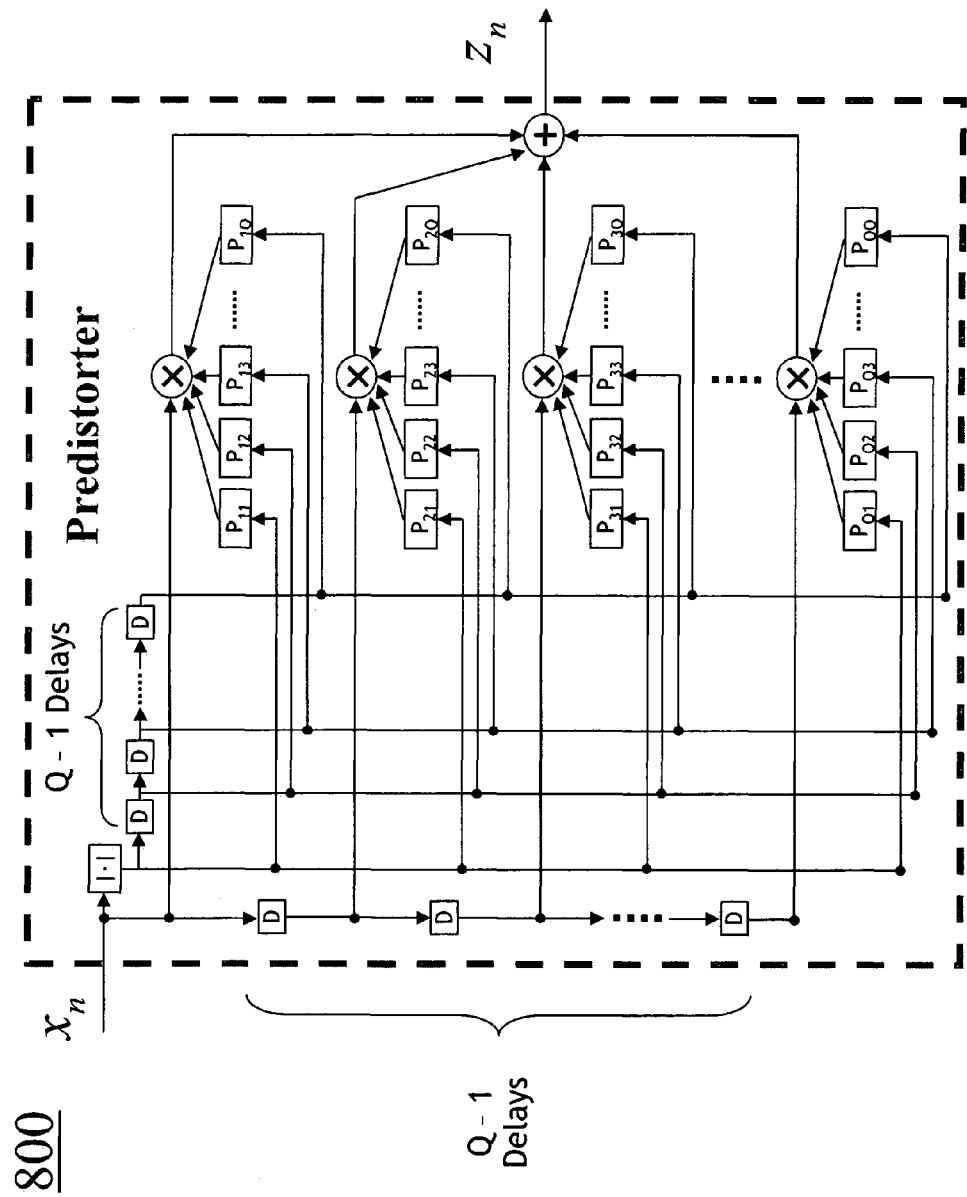
FIG. 8 is a block diagram depiction illustrating a first architecture for a separable-function predistorter with K=Q and where $P_{kq}$ is a function of $|x|$.
Figure 9:
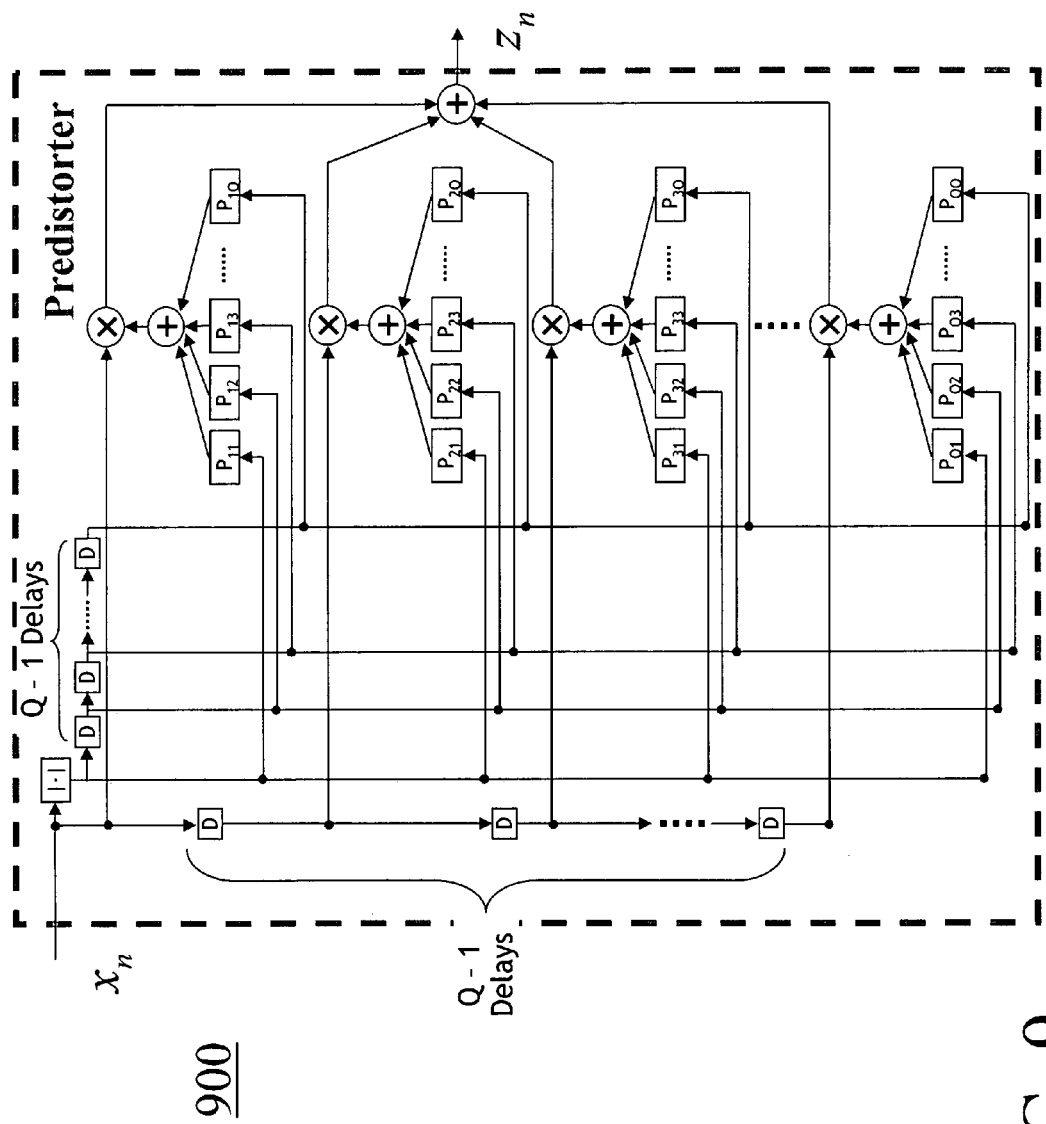
FIG. 9 is a block diagram depiction illustrating a second architecture for a separable-function predistorter with K=Q and where $P_{kq}$ is a function of $|x|$.

FIGS. 8 and 9 are block diagram depictions illustrating two architectures for a separable-function predistorter with K=Q and where $P_{kq}$ is a function of |x|. In other embodiments, the values of K and Q may be different.

It can be advantageous for each $P_{kq}$ to be implemented, for example, by using a LUT (of complex value) with fewer numbers of bits. For another example, each $P_{kq}$ may be implemented as a function of amplitude of |x|, i.e., $P_{kq} = P_{kq}(|x|)$. In this example, $P_{kq} = P_{kq}(|x|)$ can be either implemented as a LUT of one real variable |x|, or a polynomial, a piecewise polynomial, or an orthogonal polynomial of |x|.

Computing the Functions in the Separable-function Predistorter.

Although the one dimensional functions $P_{kq}$ in diagrams 800 and 900 can be implemented by any methods, such as polynomials, an algorithm in which these functions are implemented by LUTs and the LUTs are computed by using a direct-approximation method is described herein. In the direct-approximation method, a multivariate function is approximated by a sum of separable functions, which are in turn decomposed into functions of one dimension $P_{kq}$. Each $P_{kq}$ is implemented by a LUT, and the entries of LUTs are found by an iterative least squares algorithm. Advantages of such a direct-approximation method can include that no assumption is made for the form of the PA transfer function (other than it is invertible), that a direct-approximation method is more accurate than a polynomial method, and that a direct-approximation is more stable to compute.

Figure 10:
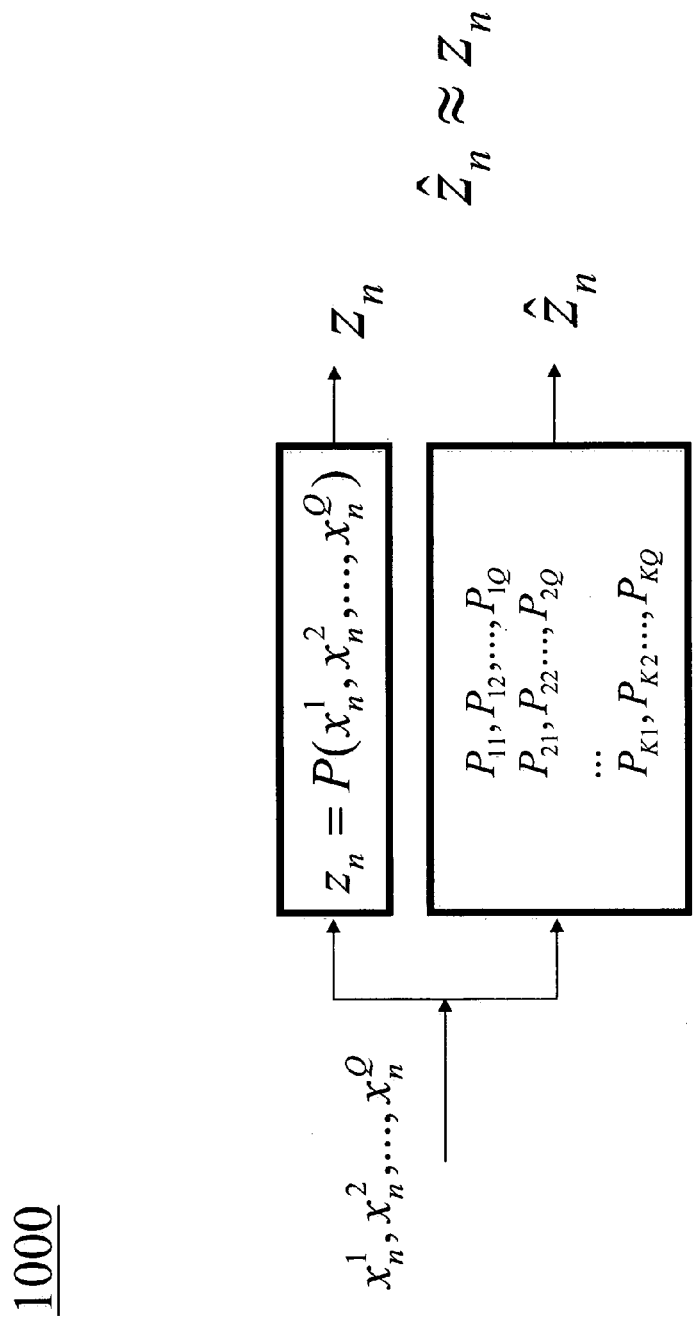
FIG. 10 is a block diagram depiction illustrating an algorithm for computing the functions in a separable-function predistorter.

FIG. 10 is a block diagram depiction illustrating an algorithm for computing the functions in a separable-function predistorter. The algorithm is described as follows:

Given sequence $x_n^1, x_n^2, \ldots, x_n^Q, z_n$, such that, $z_n = P(x_n^1, x_n^2, \ldots, x_n^Q)$, Find 1D functions (LUTs):
$P_{11}, P_{12}, \ldots, P_{1Q}$
$P_{21}, P_{22}, \ldots, P_{2Q}$
$\ldots$
$P_{K1}, P_{K2}, \ldots, P_{KQ}$ such that $$z_n \approx \hat{z}_n = P_{11}(x_n^1) P_{12}(x_n^2) \ldots P_{1Q}(x_n^Q)$$
$$+ P_{21}(x_n^1) P_{22}(x_n^2) \ldots P_{2Q}(x_n^Q)$$
$$+ \ldots$$
$$+ P_{K1}(x_n^1) P_{K2}(x_n^2) \ldots P_{KQ}(x_n^Q), n=1,2,\ldots$$

The independent variables $x_n^q$ are quantized into B bits. Each $P_{kq}$ has therefore $2^B$ entries. The entries are computed by an iterative least squares method. In each iteration, the entries of one $P_{kq}$ are computed to minimize $\|\hat{z}_n - z_n\|$.

Implementation

Figure 11:
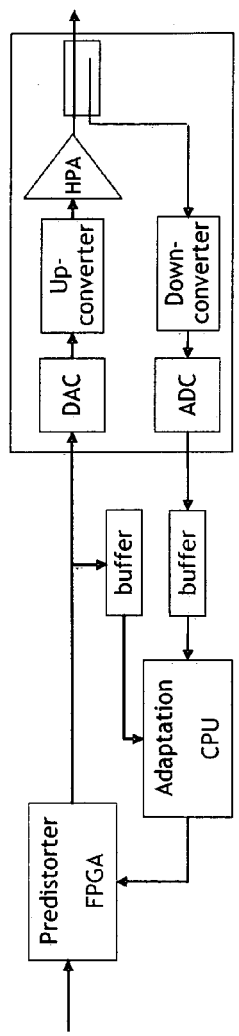
FIG. 11 is a block diagram depiction illustrating an architecture for implementing various predistortion algorithms to linearize the output of a high power amplifier (HPA) in a hardware platform.

FIG. 11 is a block diagram depiction illustrating an architecture for implementing various predistortion algorithms to linearize the output of a high power amplifier (HPA) in a hardware platform. The predistorter should be implemented in an FPGA, since the data is be processed in real time. The operation of the predistorter is relatively simple. It generally involves table look-up and complex multipliers.

The adaptation algorithm is normally run on a CPU due to large amount of floating-point arithmetic computations. Also, the adaptation does not need to run real time. The requirement for the rate of adaptation is that it needs to be fast enough to adapt to the change of characteristics of the PA. In digital TV broadcast systems, the change in PA characteristics are caused by temperature variations, or the aging of the PA. Both changes are slow in nature. Therefore, the speed of the adaptation is not a concern for digital TV broadcast systems.

Stability

The stability of adaptation for the algorithms described previously is now analyzed. In polynomial predistortion, the stability problem arises in solving for the least squares solution of the equation described in "The Computation of Polynomial Predistortion" section above.

$$Ac = z.$$

The matrix A obtained in polynomial predistortion usually has very large condition number. A large condition number of A causes the solution of the system to be very sensitive to both numerical errors caused in floating point computation, and the noise present in the samples used in adaptation algorithms. The problem is even worse if the normal equations are used to find the coefficients $$A^T Ac = A^T z.$$

This is because the condition number of $A^T A$ is the square of that of A, i.e., $$\text{cond}(A^T A) = \text{cond}(A)^2$$

In simulations, we have found that the condition number of the system may be larger than $10^{10}$, which means a relative error may be potentially magnified by $10^{10}$ times in the solution.

One way to alleviate the problem is to avoid the normal equations. Instead, the QR decomposition is performed on matrix A, and the least squares solution is found by a back-substitution. In the QR decomposition, $$A = QR$$

where Q is an orthogonal matrix, and R is an upper triangular matrix. The least squares solution is found by solving $$Rc = Q^T z$$

using back-substitution.

A more stable method is to use orthogonal polynomials. For example, shifted and scaled Legendre polynomials can be used to reduce the condition number.

$$z_n = P(x_n, x_{n-1}, \ldots, x_{n-Q+1}) = \sum_{q=1}^{Q} x_{n-q} \sum_{k=0}^{K} L_k(|x_{n-q}|),$$

In above, $L_k(|x_{n-q}|)$ are shifted and scaled Legendre polynomial on the interval $[0, X_{max}]$. Using the shifted and scaled Legendre polynomials, the condition number of A can be reduced from more than $10^{10}$ to less than $10^5$.

Since mathematically, the orthogonal polynomials are equivalent to polynomials, and their complexity is the same, orthogonal polynomials should nearly always be used in predistortion.

In the direct-approximation method, each entry of the LUTs are computed directly, without needing to solve a system of equations. There is no issue of large condition number in the direct-approximation method. The entries of LUTs are also updated iteratively, with each iteration scaled by a damping factor. The damping factor tends to reduce the propagation of error or noise, and hence the method is stable. Simulation has demonstrated that the direct-approximation method is stable.

The detailed and, at times, very specific description above is provided to effectively enable a person of skill in the art to make, use, and best practice the present invention in view of what is already known in the art. In the examples, specifics are provided for the purpose of illustrating possible embodiments of the present invention and should not be interpreted as restricting or limiting the scope of the broader inventive concepts.

Benefits, other advantages, and solutions to problems have been described above with regard to specific embodiments of the present invention. However, the benefits, advantages, solutions to problems, and any element(s) that may cause or result in such benefits, advantages, or solutions, or cause such benefits, advantages, or solutions to become more pronounced are not to be construed as a critical, required, or essential feature or element of any or all the claims.

As used herein and in the appended claims, the term "comprises," "comprising," or any other variation thereof is intended to refer to a non-exclusive inclusion, such that a process, method, article of manufacture, or apparatus that comprises a list of elements does not include only those elements in the list, but may include other elements not expressly listed or inherent to such process, method, article of manufacture, or apparatus. The terms a or an, as used herein, are defined as one or more than one. The term plurality, as used herein, is defined as two or more than two.

The term another, as used herein, is defined as at least a second or more. Unless otherwise indicated herein, the use of relational terms, if any, such as first and second, top and bottom, and the like are used solely to distinguish one entity or action from another entity or action without necessarily requiring or implying any actual such relationship or order between such entities or actions.

The terms including and/or having, as used herein, are defined as comprising (i.e., open language). The term coupled, as used herein, is defined as connected, although not necessarily directly, and not necessarily mechanically. Terminology derived from the word "indicating" (e.g., "indicates" and "indication") is intended to encompass all the various techniques available for communicating or referencing the object/information being indicated. Some, but not all, examples of techniques available for communicating or referencing the object/information being indicated include the conveyance of the object/information being indicated, the conveyance of an identifier of the object/information being indicated, the conveyance of information used to generate the object/information being indicated, the conveyance of some part or portion of the object/information being indicated, the conveyance of some derivation of the object/information being indicated, and the conveyance of some symbol representing the object/information being indicated. The terms program, computer program, and computer instructions, as used herein, are defined as a sequence of instructions designed for execution on a computer system. This sequence of instructions may include, but is not limited to, a subroutine, a function, a procedure, an object method, an object implementation, an executable application, an applet, a servlet, a shared library/dynamic load library, a source code, an object code and/or an assembly code.

What is claimed is:

1. A method of performing predistortion comprising:
generating predistorted signal $z_n$ from input signal $x_n$ in accordance with $$\begin{aligned}z_n &= \sum_{k=1}^{K}\prod_{q=1}^{Q} P_{kq}(x_{n-q-1}) \\ &= P_{11}(x_n)P_{12}(x_{n-1})\ldots P_{1Q}(x_{n-Q-1}) \\ &\quad + P_{21}(x_n)P_{22}(x_{n-1})\ldots P_{2Q}(x_{n-Q-1}) \\ &\quad + \ldots \\ &\quad + P_{K1}(x_n)P_{K2}(x_{n-1})\ldots P_{KQ}(x_{n-Q-1})\end{aligned}$$

for K terms and Q–1 delays, wherein each $P_{kq}$ is a complex valued function of a single complex variable.

2. The method as recited in claim 1, further comprising: using a polynomial to compute the value of at least one $P_{kq}$.

3. The method as recited in claim 1, further comprising: using a look-up-table (LUT) to compute the value of at least one $P_{kq}$.

4. The method as recited in claim 1, wherein K=Q.

5. The method as recited in claim 4, wherein $$\begin{aligned}z_n &= \sum_{k=1}^{Q}\prod_{q=1}^{Q} P_{kq}(x_{n-q-1}) \\ &= x_n P_{11}(x_n)P_{12}(x_{n-1})\ldots P_{1Q}(x_{n-Q-1}) \\ &\quad + x_{n-1}P_{21}(x_n)P_{22}(x_{n-1})\ldots P_{2Q}(x_{n-Q-1}) \\ &\quad + \ldots \\ &\quad + x_{n-Q-1}P_{K1}(x_n)P_{K2}(x_{n-1})\ldots P_{KQ}(x_{n-Q-1}).\end{aligned}$$

6. The method as recited in claim 5, wherein $P_{kq}$ is implemented as a function of the amplitude of x, where $P_{kq}=P_{kq}(|x|)$.

7. The method as recited in claim 6, wherein each $P_{kq}$ is computed using at least one of
a look-up-table (LUT) of one real variable |x|,
a polynomial of |x|,
a piecewise polynomial of |x|, or
an orthogonal polynomial of |x|.

8. The method as recited in claim 1, wherein $P_{kq}$ is implemented as a function of the amplitude of x, where $P_{kq}=P_{kq}(|x|)$.

9. The method as recited in claim 1, wherein each $P_{kq}$ is computed using a look-up-table (LUT), wherein the entries of at least one of the LUTs is computed using an iterative least squares technique.

10. The method as recited in claim 1, wherein $P_{kq}=1$ for $P_{kq}$ for some k.

11. The method as recited in claim 1, wherein generating predistorted signal $z_n$ from input signal $x_n$ comprises:
generating by a field-programmable gate array (FPGA) pre-distorted signal $z_n$ from input signal $x_n$.

12. A predistorter comprising:
complex multipliers for multiplying the value of each $P_{kq}$ having the same value of k to produce K products;
at least one adder for adding the K products to generate predistorted signal $z_n$ from input signal $x_n$ in accordance with $$\begin{aligned}z_n &= \sum_{k=1}^{K}\prod_{q=1}^{Q} P_{kq}(x_{n-q-1}) \\ &= P_{11}(x_n)P_{12}(x_{n-1})\ldots P_{1Q}(x_{n-Q-1}) \\ &\quad + P_{21}(x_n)P_{22}(x_{n-1})\ldots P_{2Q}(x_{n-Q-1}) \\ &\quad + \ldots \\ &\quad + P_{K1}(x_n)P_{K2}(x_{n-1})\ldots P_{KQ}(x_{n-Q-1})\end{aligned}$$

for K terms and Q–1 delays, wherein each $P_{kq}$ is a complex valued function of a single complex variable.

13. The predistorter as recited in claim 12, wherein the predistorter comprises a field-programmable gate array (FPGA) upon which the complex multipliers and the at least one adder are realized.

* * * * *